(12) United States Patent
Maitland

(10) Patent No.: US 6,631,646 B1
(45) Date of Patent: Oct. 14, 2003

(54) ELECTRICALLY INSULATED STRAIN GAGE

(75) Inventor: William David Maitland, Arlington, MA (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 09/252,502

(22) Filed: Feb. 18, 1999

Related U.S. Application Data
(60) Provisional application No. 60/075,135, filed on Feb. 18, 1998.

(51) Int. Cl.$^7$ ................................................. G01B 5/00
(52) U.S. Cl. ......................................................... 73/777
(58) Field of Search ........................... 73/777, 727, 721, 73/708, 781, 766, 760, 774, 862.68, 862.627; 428/458; 338/2

(56) References Cited

U.S. PATENT DOCUMENTS

| | | | | |
|---|---|---|---|---|
| 4,151,502 A | * | 4/1979 | Kurihara et al. ................ 338/2 |
| 4,510,671 A | | 4/1985 | Kurtz et al. |
| 4,576,052 A | * | 3/1986 | Sugiyama ..................... 73/727 |
| 4,658,279 A | * | 4/1987 | Guckel ......................... 73/777 |
| 4,737,756 A | * | 4/1988 | Bowman ....................... 338/4 |
| 5,181,417 A | * | 1/1993 | Nishida et al. ................ 73/115 |
| 5,185,292 A | * | 2/1993 | VanVonno et al. ............. 438/59 |
| 5,191,798 A | * | 3/1993 | Tabata et al. .................. 338/4 |
| 5,192,938 A | * | 3/1993 | Ort ............................. 73/774 |
| 5,460,050 A | * | 10/1995 | Miyano ........................ 73/766 |
| 5,518,951 A | | 5/1996 | Paynter et al. |
| 5,622,901 A | | 4/1997 | Fukada |
| 5,631,622 A | * | 5/1997 | Hauber et al. ................ 338/2 |
| 5,646,432 A | * | 7/1997 | Iwaki et al. .................. 257/347 |
| 5,772,322 A | * | 6/1998 | Burns et al. ................. 374/118 |
| 5,773,728 A | * | 6/1998 | Tsukada et al. ........... 73/862.68 |
| 5,793,047 A | * | 8/1998 | Kobayashi et al. ..... 250/370.09 |
| 6,242,729 B1 | * | 6/2001 | Izumi et al. ............. 250/208.1 |

OTHER PUBLICATIONS

Xing et al, "An Ion Implanted SOM Pressure Sensor", 2107B Nuclear Instrum. & Methods in Phys. Res. /B. B37/38 (1989) Febr. (II). No. 2. Amsterdam. NL.

Shor et al, Characterization of Monolithic η–Type 6H–SiC Piezoresistive Sensing Elements, 8093 IEEE Transactions on Electron Devices. 41 (1994) May No. 5. New York. NY. US.

\* cited by examiner

*Primary Examiner*—Max Noori
(74) *Attorney, Agent, or Firm*—Kris T. Fredrick

(57) ABSTRACT

An insulated strain gage including a layer of semiconductive material and a layer of insulating material, where a side of the first insulating layer is disposed adjacent to a side of the semiconductive layer. A method of manufacturing the insulated strain gage includes the steps of forming an insulating layer of insulating material, and depositing a semiconductive layer of semiconductive material on top of the first insulating layer. The bottom side of the semiconductive layer is adjacent to a top side of the insulating layer. The insulated strain gage may be part of an apparatus for measuring strain on an object. The apparatus measures the strain on an object by translating deformations of the object resulting from an applied force into electrical signals. The apparatus includes a sensor, a insulated strain gage, and a circuit. The insulated strain gage includes an insulating layer and is bonded to the mechanical sensor by an adhesive. The circuit is connected to the insulated strain gage and receives signals indicating an electrical value of the insulated strain gage.

40 Claims, 7 Drawing Sheets

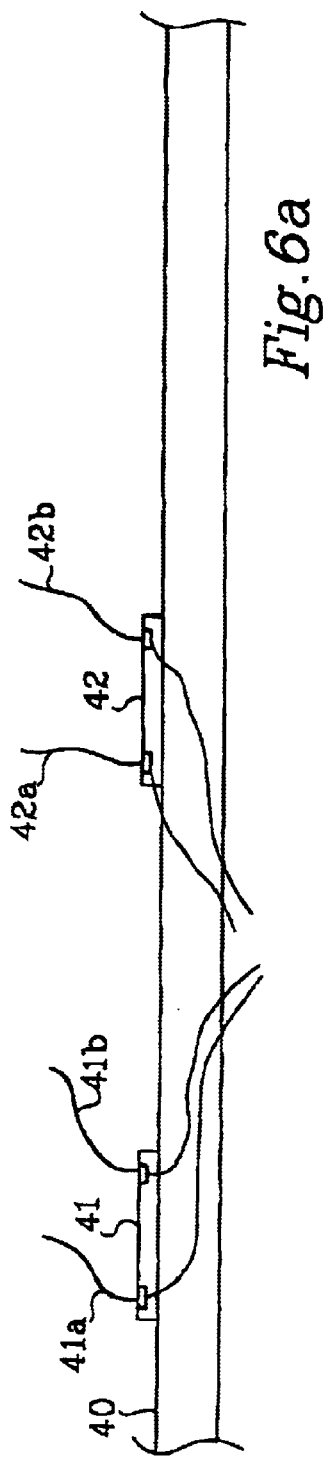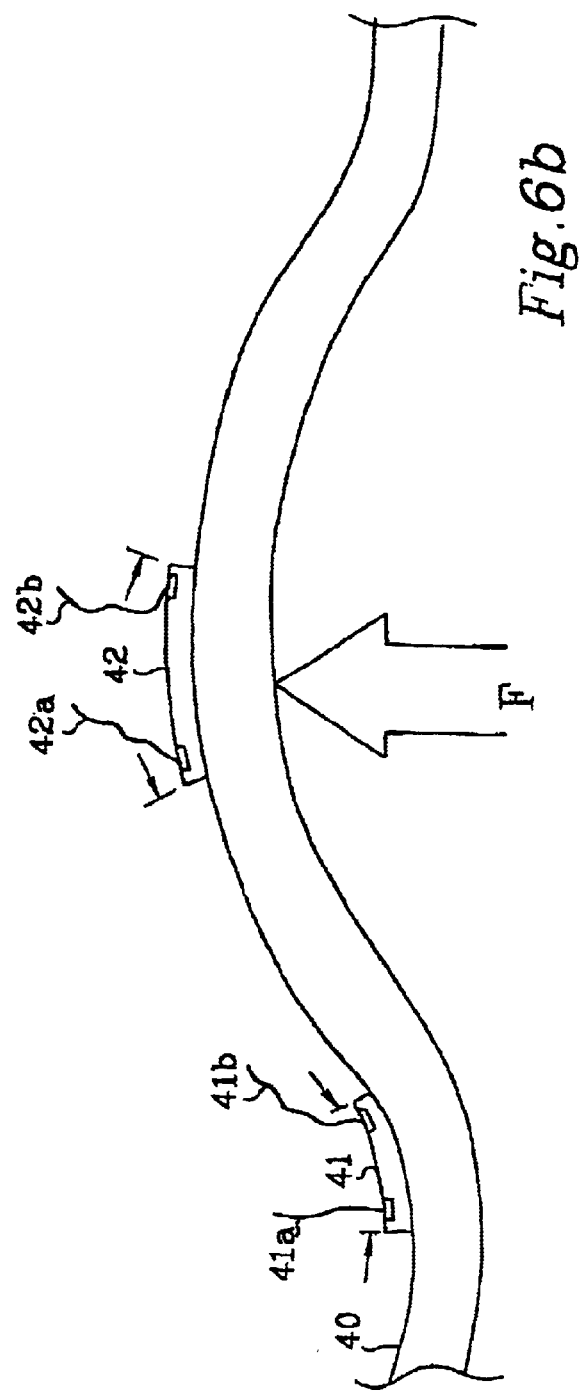

ELECTRICALLY INSULATED STRAIN GAGE

CROSS REFERENCE TO RELATED APPLICATIONS

This application claims the benefit of prior filed provisional application entitled, "Silicon On Insulator Strain Gage," Ser. No. 60/075,135, filed Feb. 18, 1998.

BACKGROUND OF THE INVENTION

1. Field of the Invention

The present invention relates generally to the field of strain measurement. More particularly, the present invention relates to using semiconductive strain gages to measure strain on an object.

2. Discussion of the Related Art

When force is applied to an object, this results in stress on the object. Stress is the force per unit area acting on the object. When an object experiences stress, the object will experience deformation, which is the change in shape of the object in any dimension. Strain is a measurement of the intensity of this deformation. More specifically, strain is the deformation per unit length of the object in any dimension resulting from stress.

Devices employing a variety of techniques are available to measure strain on an object. Typically, these devices translate the mechanical strain on an object into an electrical signal. Strain gages are commonly used in such devices.

One type of conventional strain gage consists of a monolith of conductive or semiconductive material whose resistance changes when the gage deforms. Typically, this type of conventional strain gage is mechanically bonded to a mechanical sensor with an adhesive to form a strain gage assembly. Specifically, as illustrated in FIG. 1, an adhesive is applied to the mechanical sensor 2 to form an adhesive layer 3, the strain gage 4 is pressed against the adhesive layer 3, and the adhesive layer 3 is allowed time to cure. It should be noted that FIG. 1 is not drawn to scale. The adhesive may be an epoxy, paste or other suitable bonding compound or agent.

In operation, when a force impacts on the mechanical sensor 2, the resultant deformation of the mechanical sensor 2 causes the strain gage 4 to similarly deform, with a resultant change in electrical resistance. This change in resistance is measured and used to provide a measurement of the strain on the mechanical sensor 2. This change in resistance may also be used to determine the stress or pressure on the mechanical sensor 2. Force cells, loads cells, pressure transducers and accelerometers are typical devices that make use of this principle.

The material of the strain gage 4 can be a conductive metal or a semiconductive material. Semiconductive materials have the advantage of providing a larger change in resistance for a given change in strain than do conductive metals. In a strain gage assembly 1, attaching a strain gage 4 of semiconductive material to a mechanical sensor 2 of metal material may result in electrical shorts or electrical leakage during operation. Specifically, shorts and leakage result when the adhesive layer 3 is too thin or unevenly applied. Subsequently, when the strain gage 3 is pressed against the mechanical member 2 and the adhesive is allowed to cure, the strain gage 4 may actually contact the mechanical member 2 at points, resulting in a short circuit between the mechanical sensor 2 and the strain gage 4.

If the adhesive layer 3 is too thin at a certain point, current will leak across the adhesive layer 3 when a sufficient voltage potential exists between the mechanical sensor 2 and the strain gage 4. The voltage at which leakage will occur is the dielectric breakdown voltage of the adhesive layer 4.

To prevent electrical shorts and electrical leakage, the strain gage 4 must be better insulated from the mechanical sensor 2. Initially, this involves choosing an insulating adhesive as opposed to a non-insulating adhesive. Conventionally, to achieve improved insulation, a filled adhesive is chosen to make the adhesive layer. The filler of a filled adhesive is typically a granular substance such as a fine powder. The purpose of using a filled adhesive is to increase the thickness of the adhesive layer 3. Increasing the thickness of the adhesive layer 3 produces a higher dielectric breakdown voltage of the adhesive layer 3. Since the breakdown voltage is higher, there is less likelihood of electrical leakage across the adhesive layer 3.

Although using a filled adhesive produces a higher dielectric breakdown voltage, the application of only one coat of filled adhesive does not provide a high enough dielectric breakdown voltage in the adhesive layer to avoid electrical shorts and electrical leakage.

Conventionally, to further improve insulation, two coats of the filled adhesive are applied to produce the adhesive layer 3. FIG. 2 is a perspective side view of a section 9 of the strain gage assembly 1 of FIG. 1 that shows in further detail the adhesive layer 3. The adhesive layer 3 includes a pre-coat 5 and a gage coat 6. During manufacturing, the pre-coat 5 of filled adhesive is applied to the mechanical sensor 2 and allowed time to cure. Next, the gage coat 6 of filled adhesive is applied to the pre-coat 5, the strain gage 4 is pressed against the gage coat 6, and the gage coat 6 is allowed time to cure. Adding the extra coat assures that the adhesive layer 3 is sufficiently thick to void electrical shorts and electrical leakage. Typically, the pre-coat 5 and gage coat 6 are of the same or similar adhesive material. The thickness of the adhesive layer 3 is represented in FIG. 2 by $t_a$.

A conventional strain gage assembly 1 of FIG. 2 that uses a strain gage 3 of semiconductive material has an adhesive layer 3 with a thickness $t_a$ of approximately 1.0 mil (25.4 $\mu$m). The dielectric strength of a material is the voltage potential at which dielectric breakdown will occur per unit length of the material. For filled adhesives typically used for the strain gage assembly 3 of FIG. 2, the dielectric breakdown of the filled adhesive is approximately 250 Volts per mil (250 V/mil; 9.84 V/$\mu$m). Therefore, the typical dielectric breakdown voltage of the adhesive layer 3 is approximately 250 Volts (250 V/mil×1.0 mil).

Using a filled adhesive and adding a second coat of adhesive increases the thickness of the adhesive layer 3. Although increasing the thickness produces a higher dielectric breakdown of the adhesive layer 3, as the thickness of the adhesive layer 3 increases, mechanical performance can decrease. Furthermore, the fillers of filled adhesives can reduce the strength of the adhesive. The filler within the adhesive may have inconsistent granule size and this can make it more difficult for the adhesive layer 3 to bond the strain gage 4 to the mechanical member 2, create high stress points in the strain gage 4, and introduce possible voids between the strain gage 4 and the adhesive layer 3.

When choosing an adhesive, one wants an adhesive with the best combination of performance parameters, for example, highest strength, highest dielectric breakdown, and broadest temperature range. The need to use a filled adhesive, however, limits the choices of adhesives for use in the adhesive layer 3 of a strain gage assembly 1.

Furthermore, as discussed above, as thickness of the adhesive layer 3 increases, mechanical performance of the adhesive layer 3 can decrease. Consequently, when choosing an adhesive, tradeoffs are made between the adhesive's strength, temperature range, and dielectric breakdown.

Therefore, the benefits of increasing the thickness of the adhesive layer 3 must be weighed against the drawbacks caused by such an increase. This results in a tradeoff between the electrical insulation provided by the adhesive layer 3 and the mechanical performance of the adhesive layer 3. The filled adhesive, the amount and granule sizes of the filler in the filled adhesive, and the thickness of the adhesive layer 3 are chosen in light of these tradeoffs. Typically, the adhesive layer 3 used in the strain gage assembly 1 of FIG. 2 has a shear strength of approximately 3,000 p.s.i. and an operating temperature range from approximately −60° F. to 250° F.

Thus, for the strain gage assembly 1 where the strain gage 4 is made of semiconductive material, it is desirable to eliminate the need for a filled adhesive and a pre-coat 5 in order to improve the mechanical performance of the adhesive layer 3, while at the same time providing sufficient electrical insulation between a strain gage 4 and the mechanical sensor 2. Furthermore, it is desirable to eliminate the need for the pre-coat 5 to save time and labor costs associated with the extra step of applying the pre-coat 5.

A conventional technique for manufacturing the strain gage 4 of semiconductive material involves mechanically or chemically cutting a small bar of semiconductor material into the appropriate shape. A diamond saw is often used for initial cutting, which results in a rough cut which must be refined by further mechanical or chemical means. Chemical cutting or shaping may involve dipping the cut pieces into a chemical pool or similar methods. Typically, several steps are required to refine the initial rough cut of the semiconductive material into the final size that also meets electrical requirements. These manual cutting and refining processes are inefficient and imprecise in comparison to the automated processes used in today's technologies.

Extracting the finished strain gages from the semiconductor bar is a costly and time consuming process. Extracting is commonly done manually, which may involve a person extracting the finished gages with the aid of tweezers and a magnifying device. The labor costs and inherent human error associated with this manual extraction process introduce more cost and inefficiency to the manufacturing of conventional strain gages.

For measuring the resistance of the strain gage 4, wires for electrical connection may be attached directly to the semiconductive material. Alternatively, contact pads may be manufactured and affixed to the strain gage as part of the gage-making process, with the wires then connected to the contact pads. Although connecting the wires directly involves fewer manufacturing steps than using contact pads, it is more difficult and costly to connect directly to silicon than to connect to a contact pad, and contact pads provide a more reliable electrical contact to the semiconductive material.

It is desirable to reduce the imprecision and costs associated with the conventional manual processes described above for manufacturing and extracting the strain gage 4.

With a mechanical sensor 2 having a thickness of approximately 0.010 in (254 μm), the conventional strain gage assembly 1 manufactured using the above techniques uses a strain gage 4 with thickness of approximately 0.0005 in (12.7 μm). As described above, a typical adhesive layer 3 has a thickness of approximately 0.0010 in (25.4 μm). Therefore, for a conventional strain gage assembly 1, the combined thickness of the strain gage 4 and the adhesive layer 3 is approximately 0.0015 in (38.1 μm)

It is desirable to reduce the thickness of the strain gage 4 and the adhesive layer 3 so as to improve the mechanical performance of the strain gage assembly 1.

SUMMARY OF THE INVENTION

Broadly, the present invention is an insulated strain gage that includes an insulating layer, where the insulated strain gage is manufactured using conventional semiconductor manufacturing techniques.

One embodiment of the invention is an insulated strain gage comprising a layer of semiconductive material and a layer of insulating material, where a side of the first insulating layer is adjacent to a side of the semiconductive layer.

Another embodiment of the invention is an apparatus for measuring the strain on an object by translating deformations of the object resulting from an applied force into electrical signals, where the apparatus comprises a mechanical sensor, at least one insulated strain gage, and a circuit. The insulated strain gage includes an insulating layer and is bonded to the mechanical sensor. The circuit is connected to the insulated strain gage to receive signals indicating an electrical value of the insulated strain gage.

BRIEF DESCRIPTION OF THE DRAWINGS

It should be understood that the drawings are provided for the purpose of illustration only and are not intended to define the limits of the invention. The foregoing and other objects and advantages of the present invention will become apparent with reference to the following detailed description when taken in conjunction with the accompanying drawings in which:

FIG. 4b is a cross-sectional side view of the insulated strain gage of FIG. 4a;

FIG. 6a is a side view of a strain gage assembly according to the invention at rest;

FIG. 6b is a side view of a strain gage assembly according to the invention under strain.

DETAILED DESCRIPTION

Figure 3:
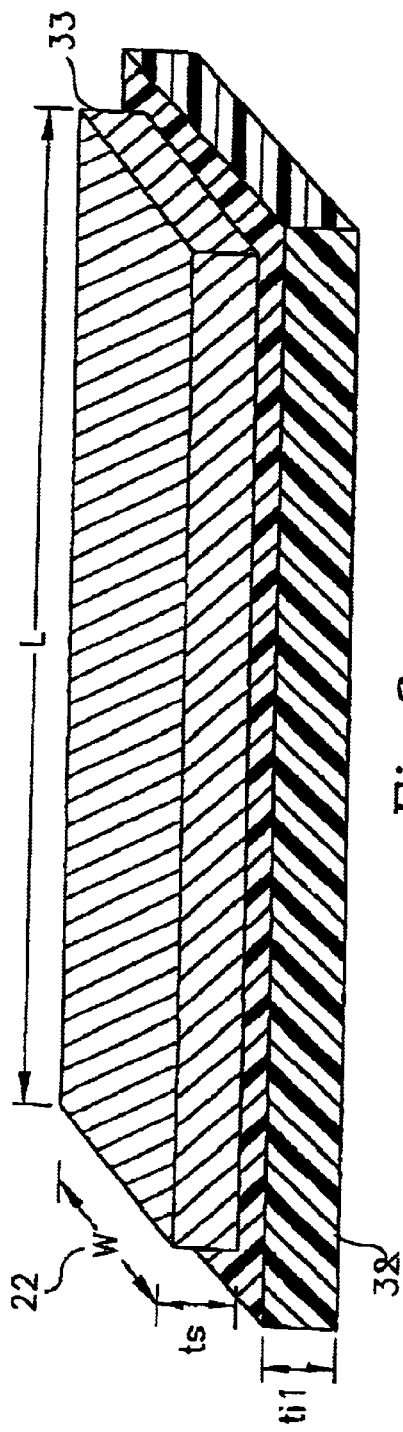
FIG. 3 is a perspective side view of an embodiment of an insulated strain gage according to the invention.

FIG. 3 illustrates an embodiment of an insulated strain gage 22 according to the invention. The insulated strain gage 22 includes an insulating layer 32 of insulating material adjacent to and in contact with a layer 33 of semiconductive material. Within this disclosure the term insulated strain gage means a monolithically integrated combination of a layer of semiconductive material disposed on an insulating substrate.

In the embodiment of FIG. 3, the insulating material may comprise $SiO_2$, but other insulating materials known by those skilled in the art to have the same or similar physical and insulating properties adequate for use in an insulated strain gage may be used. Also, in the embodiment of FIG. 3, insulating layer 32 has a thickness $t_{il}$ of approximately 2.0 μm and a dielectric strength of approximately 500 V/μm. These parameters produce a breakdown voltage of approximately 1000 V. The insulating layer 32 can serve as an integral insulator for the insulated strain gage 22 when the insulated strain gage 22 is part of a strain gage assembly as will be described in more detail below.

In the embodiment of FIG. 3, the semiconductive material is silicon because the electrical properties of silicon are well known to those of skill in the art, and because conventional fabrication techniques have developed around the use of silicon. Alternatively, germanium or some other suitable semiconductive material known to those of skill in the art may be used as the semiconductive material. In the embodiment of FIG. 3, semiconductive layer 33 has a thickness $t_s$ of approximately 2.0 μm. Thus, in the embodiment of FIG. 3, the thickness of the insulated strain gage 22 is the combined thickness of the insulating layer 32 and the semiconductive layer 33, which is approximately 4.0 μm. Alternatively, semiconductive layer 33 could be thinner than 2.0 μm. For example, layer 33 could have a thickness $t_s$ of approximately 1.0 μm. At this thickness, however, more careful calibration of semiconductor fabricating machines may be required so as to have more precise machine tolerances. For example, a typical semiconductor fabricating machine tolerance of ±0.5 μm would be 50% of 1.0 μm, and a more careful calibration of the machine would probably be desired.

In the embodiment of FIG. 3, semiconductive layer 33 is doped with Boron ions. Alternatively, other impurities of a p-type conductivity may be used as the dopant. Also, n-type dopants may be used depending on the desired polarities, resistive, and thermal properties of semiconductive layer 33, as will be understood by those of skill in the art of semiconductor manufacturing. The quantity of impurity used will impact the resistivity, or conversely the conductivity, of the semiconductive layer. In the embodiment of FIG. 3, the semiconductive material is doped with a quantity of impurities that produce a resistivity of approximately 0.12 Ω-cm, although the amount of doping may be varied according to the desired electrical characteristics for the insulated strain gage 22.

Figure 4B:
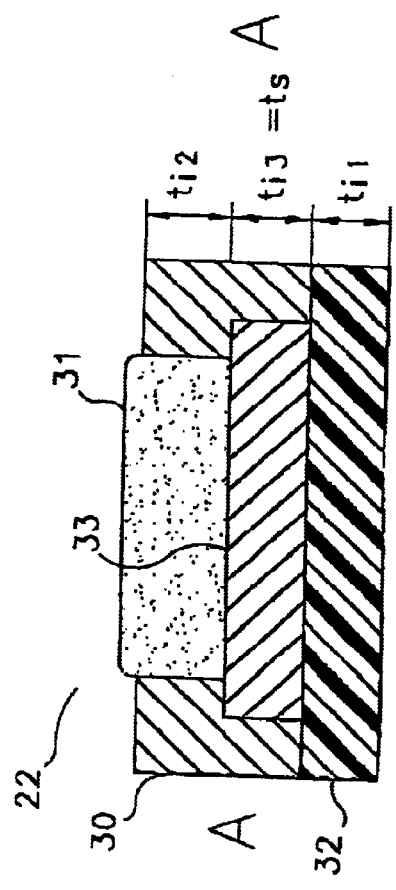
Figure 4A:
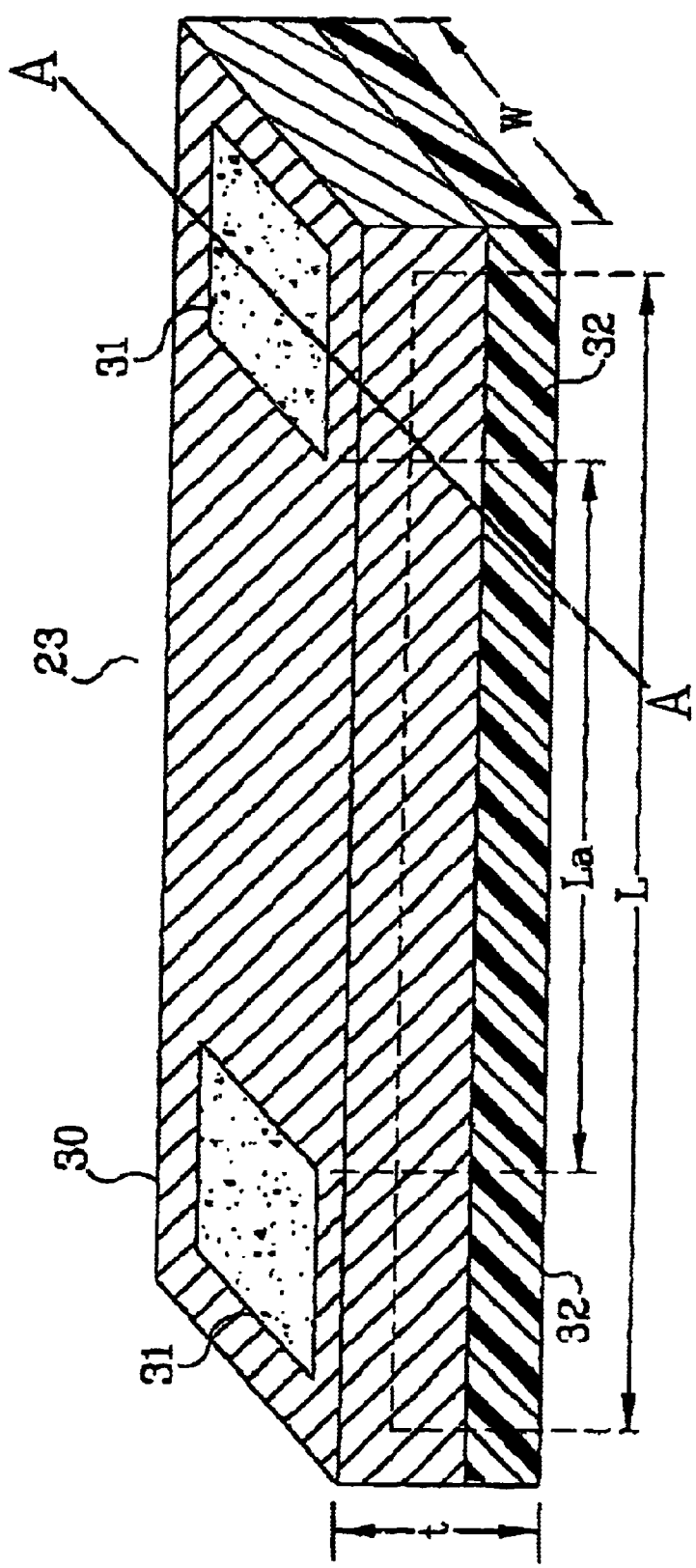
FIG. 4a is a perspective side view of another embodiment of an insulated strain gage according to the invention.

FIGS. 4a and 4b illustrate an embodiment of an insulated strain gage 23 according to the invention. FIG. 4b illustrates a cross-sectional side view along line a—a of FIG. 4a. Insulated strain gage 23 includes the insulated strain gage 22 with the addition of another insulating layer 30 of insulating material and contact pads 31 of conducting material. As can be seen in FIGS. 4a and 4b, insulating layer 30 is adjacent to the sides and the top of semiconductive layer 33. Further, contact pads 31 extend from the top side of insulating layer 30 to a bottom side of insulating layer 30 where contact pads 31 contact semiconductive layer 33.

In the embodiment of FIG. 4b, insulating layer 30 comprises $SiO_2$, which is the same material as insulating layer 32, but other insulating materials known by those skilled in the art to have the same or similar physical and insulating properties adequate for use in an insulated strain gage 23 may be used. Also, in the embodiment of FIG. 4b, insulating layer 32 has both a top side thickness $t_{12}$ and lateral side thickness $t_{13}$ of approximately 2.0 μm. Thus, in the embodiment of FIG. 4b, the thickness of the insulated strain gage 23 is the combined thickness of insulating layer 32, semiconductive layer 33, and insulating layer 30, which is approximately 6.0 μm.

In the embodiment of FIG. 4a, the conducting material of contact pads 31 is aluminum. Alternatively, other conducting materials, particularly metals, with suitably high electrical conductivity and thermal resistance may be used, as is well known to those of skill in the art of semiconductor manufacturing. These contact pads 31 can be used to connect the insulated strain gage 23 to an electrical circuit with, for example, wire bonds.

The resistance of the insulated strain gage 23 is $r = (\sigma \times 1_a)/(w \times t)$, where σ is the resistivity of the semiconductive layer 33, $1_a$ is the active length of the semiconductive layer 33, w is the width of the semiconductive layer 33, and $t_s$ is the thickness of the semiconductive layer 33. The active length is the length of the semiconductive layer 33 between the contact pads 31. In the embodiment of FIG. 4a the semiconductive layer 33 has a resistance of 5,000 Ω, thickness $t_s$=2.0 μm, and resistivity σ of 0.12 Ω-cm, where the width w and the active length $1_a$ of the semiconductive layer 33 can be designed to achieve the resistance of 5000 Ω. Of course, the manufacturing process can be altered to change any of these parameters to produce an insulated strain gage having a desired size and shape as well as desired electrical and mechanical properties.

One aspect of the invention is that conventional semiconductor manufacturing techniques can be used to make the insulated strain gage 22 or 23. Specifically, conventional methods known to those of skill in the art of semiconductor manufacturing can be used to form the insulating layers 30 and 32 and the semiconductive layer 33, dope the semiconductive layer 33, etch openings in insulating layer 30, and fill the openings with conducting material to form contact pads 31.

The precision of an automated semiconductor fabrication process produces very even and precise insulation layers 32 and 30 and semiconductive layer 33 in comparison to the manual processes of conventional strain gage manufacturing used to produce the conventional strain gage 4 and adhesive layer 3. Furthermore, using automated semiconductor fabrication reduces the cost of making a strain gage by eliminating conventional manufacturing labor costs associated with manually refining a silicon block and extracting individual strain gages from the block.

Figure 1:
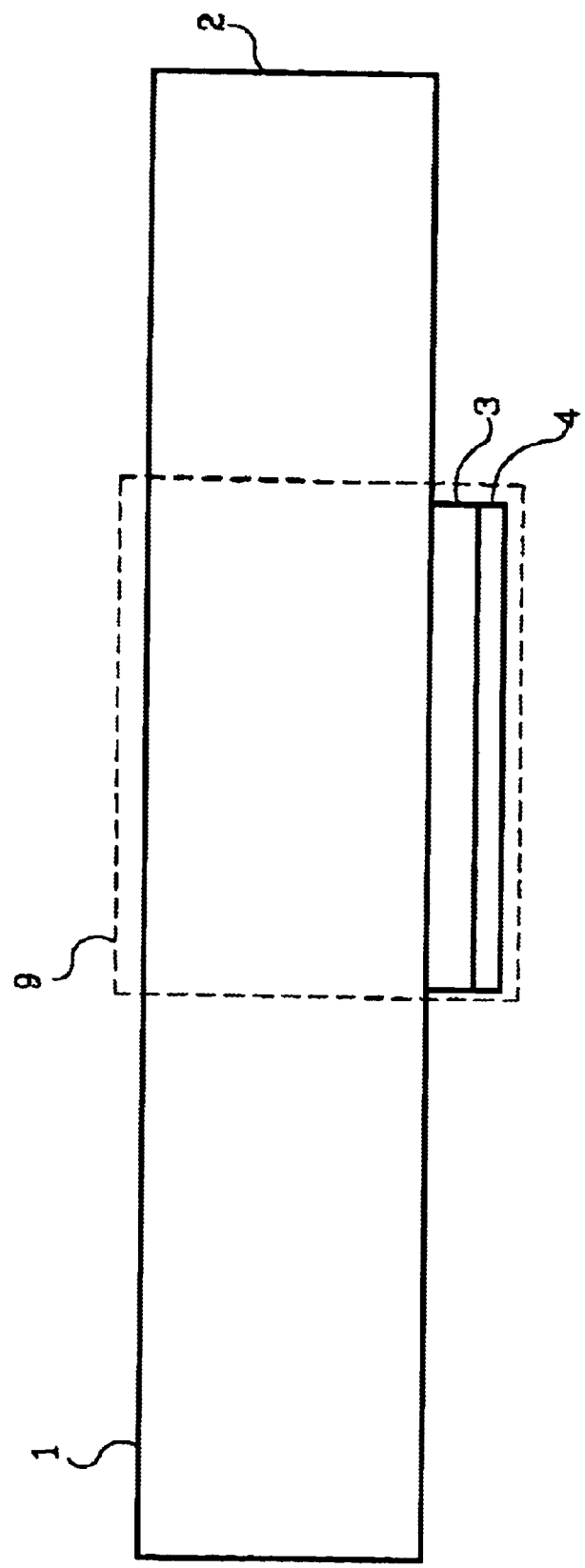
FIG. 1 is a side view of a conventional strain gage assembly.
Figure 2:
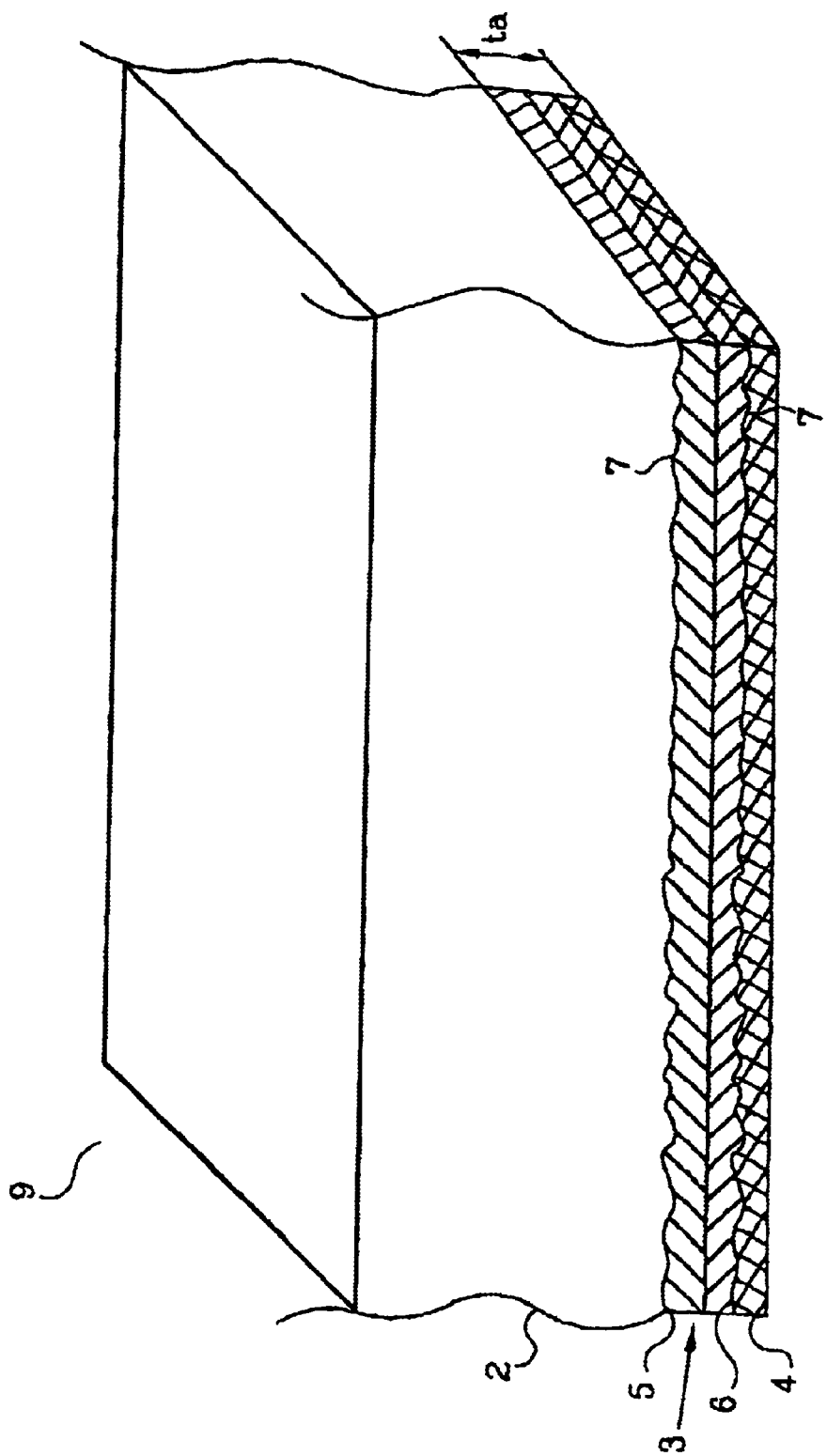
FIG. 2 is a perspective side view of a portion of the conventional strain gage assembly of FIG. 1.
Figure 5:
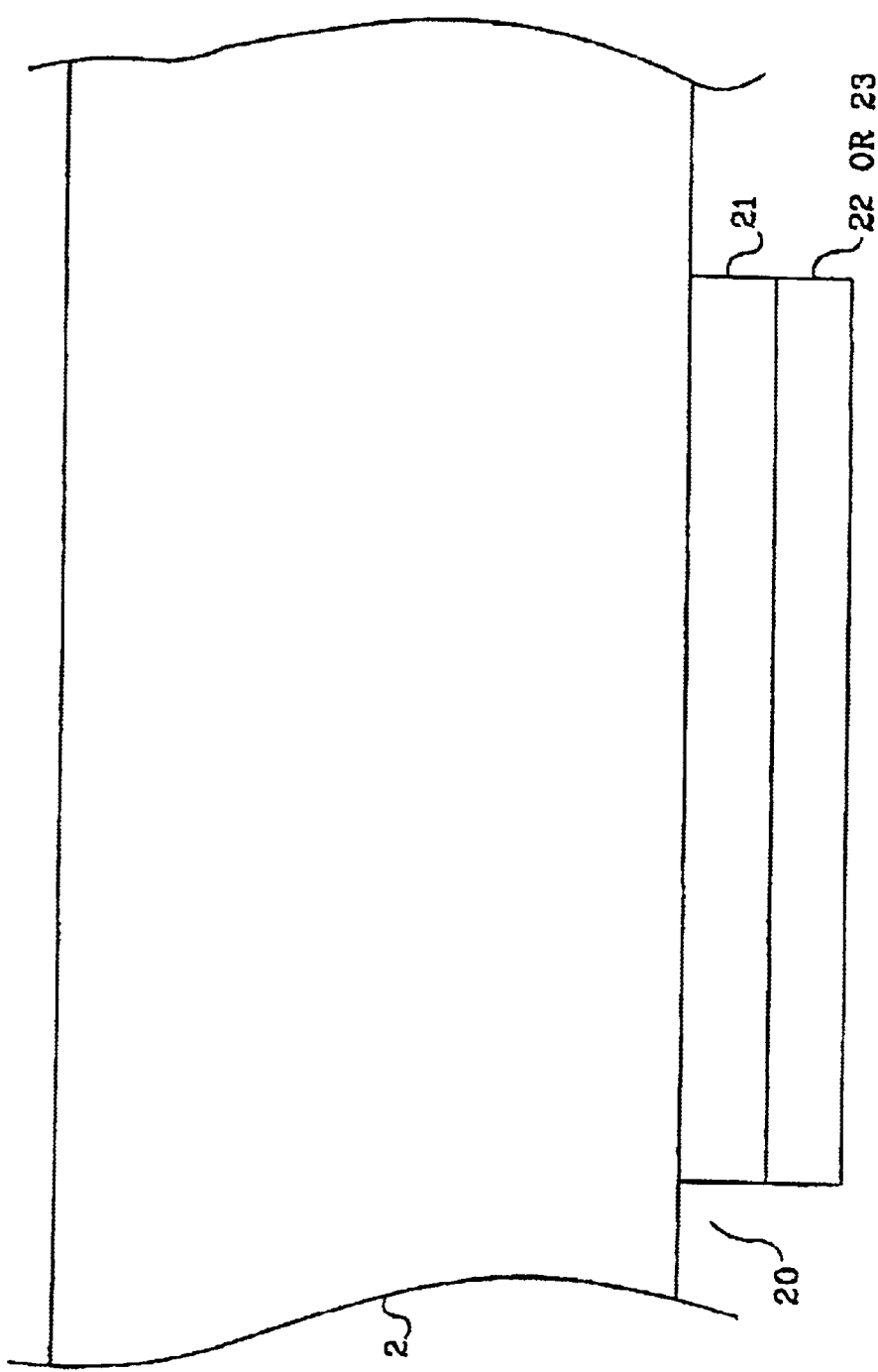
FIG. 5 is a side view of a strain gage assembly including the insulated strain gage of FIGS. 4a and 4b and an adhesive layer.

FIG. 5 illustrates an embodiment of a portion of a strain gage assembly 20 including the insulated strain gage 23, or, alternatively, insulated strain gage 22 according to the invention. Strain gage assembly 20 includes a mechanical sensor 2 that is the same or similar to the mechanical sensor 2 of the conventional strain gage assembly 1 illustrated in FIG. 1. The strain gage assembly 20 also includes an adhesive layer 21 of adhesive and the insulated strain gage 23. The integral insulating layer 32 of the insulated strain gage 23 produces a strain gage assembly 20 with several advantages over the conventional strain gage assembly 1 of FIG. 1, as will be discussed below.

In the strain gage assembly 20, the insulating layer 32 insulates the insulated strain gage 23 from the mechanical member 2. As discussed above, insulating layer 32 has a breakdown voltage of approximately 1000 V. This is an improvement over the breakdown voltage of 500 V of the adhesive layer 3, which provided insulation for the conventional strain gage assembly 1.

In the conventional strain gage assembly 1, the adhesive layer 3 insulated the strain gage 4 from the mechanical member 2. According to the invention, however, the insulating layer 32 insulates the semiconductive layer 33 of the insulated strain gage 23 from the mechanical member 2. Consequently, the adhesive layer 21 no longer needs to provide insulation. Therefore, the adhesive layer 21 may be chosen solely for its mechanical performance, without concern for its insulating properties. Further, the high breakdown voltage of the insulator 32 eliminates the need to use a filled adhesive to increase the breakdown voltage of the adhesive layer 21, which, as discussed above, impaired the bonding properties and consistency of the adhesive layer 3. Thus, the chosen adhesive for adhesive layer 21 may be an unfilled adhesive, thereby improving the bonding properties of the adhesive layer 21.

Also, because of the high breakdown voltage and even application of the insulating layer 32, a pre-coat is no longer needed to prevent electrical shorts and electrical leaks. Since, as discussed above, the pre-coat 5 further impairs the mechanical performance of the adhesive layer 3, eliminating the need for the pre-coat 5 further improves the mechanical performance of the adhesive layer 21.

Therefore, being able to choose a non-insulating, unfilled adhesive and not needing a pre-coat results in an adhesive layer 21 with improved strength over the adhesive layer 3 of the conventional strain gage assembly 1. In the embodiment of FIG. 5, the adhesive layer 21 has a shear strength between 3,000 and 5,000 p.s.i. and has an operating temperature range from approximately −60° F. to 257° F.

The ability to use a non-insulating, unfilled adhesive substantially reduces the thickness of the adhesive layer 21. In the embodiment of FIG. 5, the adhesive layer 21 has a thickness of approximately 6.0 $\mu$m, as opposed to a thickness of approximately 25.4 $\mu$m for the adhesive layer 3 of the conventional strain gage assembly 1. Also in the preferred embodiment of FIG. 5, the insulated semiconductor strain gage 22 or 23 has a thickness of approximately 4.0 $\mu$m or 6.0 $\mu$m, respectively. Thus, the combined thickness of the insulated strain gage 22 or 23 and the adhesive layer 21 of approximately 10.0 $\mu$m or approximately 12.0 $\mu$m, respectively, represents over a 66% reduction from the combined thickness of the conventional strain gage 4 and adhesive layer 3 of 38.1 $\mu$m. This reduced thickness results in an improved mechanical performance of the strain gage assembly 20.

The insulated strain gage 22 or 23 can be used as a part of variety of devices known to those of skill in the art, such as force cells, loads cells, pressure transducers and accelerometers. Combinations of insulated strain gages 22 and 23 can be used in combination with electrical circuitry to measure forces acting on a mechanical device.

FIGS. 6a and 6b illustrate an embodiment of a pair of insulated strain gages 41 and 42 being used in combination with a mechanical sensor or beam 40. The strain gages 41 and 42 each may be either insulated semiconductor strain gage 22 or 23. FIG. 6a shows the combination at rest. FIG. 6b shows a force F applied to beam 40. Force F causes beam 40 to bend causing a strain on beam 40. This bend causes strain gage 42 to stretch or be in tension, and causes strain gage 41 to compress or be in compression. For this reason, strain gage 41 is called the compression gage and strain gage 42 is called the tension gage.

In the embodiment of FIG. 6a, two wire bounds 41A and 41B are each connected to an end of compression gage 41, and two wire bounds 42A and 42B are each connected to an end of tension gage 42. If the insulated strain gage 41 or 42 is of the embodiment of insulated strain gage 23, the wire bounds connect to contact pads 43. The signals on the wire bounds indicate the change in resistance across each strain gage. In FIG. 6a, the resistance across compression gage 41 will decrease and the resistance across tension gage 42 will increase. These wire bounds can be a part of the circuitry for calculating the strain on beam 40 as a function of the change in resistance.

Figure 7:
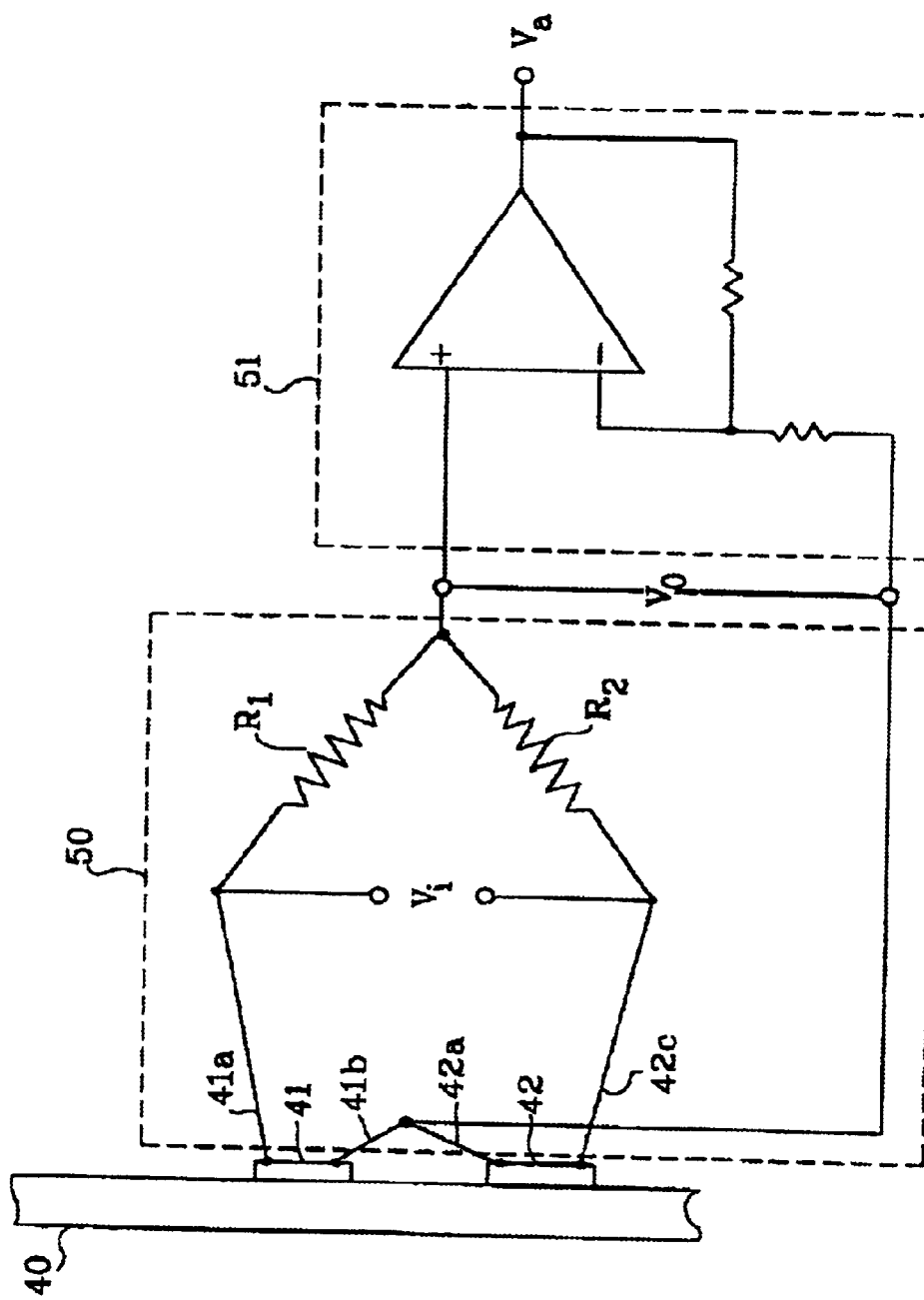
FIG. 7 is a schematic diagram illustrating a Wheatstone Bridge circuit with two insulated strain gages coupled to an amplifier circuit according to the invention.

FIG. 7 illustrates one example of such circuitry that includes a Wheatstone Bridge configuration 50. Wheatstone bridges are ideal for accurately measuring small changes in resistance. In the first embodiment, strain gage 41 and 42 are connected in series with respect to an input potential Vi and in parallel with respect to an output potential Vo. An excitation signal produces an input voltage Vi of the order of several volts. This configuration could be part of a pressure transducer or other such mechanical-electrical translating devices.

As discussed above in the embodiment of FIG. 4, the resistance of the insulated strain gage 23, or, alternatively, the insulated strain gage 22, is approximately 5,000 $\Omega$. Thus, the resistance of each of the strain gages 41 and 42 is approximately 5,000 $\Omega$. With such a high impedance and an input potential of several volts, the resulting output potential Vo will be of the order of millivolts. In the embodiment of FIG. 7, amplification circuitry 51 is coupled to the output signal Vo to produce an output potential Va of the desired range.

The use of conventional semiconductor wafer technology makes the insulated strain gage 23 especially useful within integrated circuits, for example, an application specific integrated circuit (ASIC). Accordingly, the circuit of FIG. 7 can be manufactured as an ASIC.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An insulated strain gage comprising:
  a sensor;
  a first layer, wherein the first layer comprises a semiconductive material;
  a second layer, wherein the second layer comprises an insulating material, wherein the second layer has first and second opposing surfaces, and wherein the first surface of the second layer is disposed adjacent to a first surface of the first layer; and,
  an unfilled adhesive bonding the second surface of the second layer to the sensor, wherein the second layer electrically insulates the first layer from the sensor.

2. The insulated strain gage of claim 1 further comprising a third layer, wherein the third layer comprises an insulating material, wherein the third layer is disposed adjacent to a second surface of the first layer, and wherein the first and second surfaces of the first layer are opposing surfaces.

3. The insulated strain gage of claim 2 wherein the third layer includes first and second opposing surfaces and first and second openings, wherein the first surface of the third layer is adjacent the second surface of the first layer, and wherein both of the first and second openings extend from the first surface of the third layer to the second surface of the third layer.

4. The insulated strain gage of claim 3 further comprising a first contact pad and a second contact pad, wherein the first and second contact pads fill the first and second openings, respectively, and wherein the first and second contact pads electrically engage opposite ends of the first layer.

5. The insulated strain gage of claim 4 wherein the first and second contact pads are aluminum.

6. The insulated strain gage of claim 2 wherein the third layer has portions adjacent to third and fourth surfaces of the first layer.

7. The insulated strain gage of claim 2 wherein the first, second , and third layers have a combined thickness of approximately 6.0 µm.

8. The insulated strain gage of claim 2 wherein the insulating materials of the second and third layers are the same material.

9. The insulated strain gage of claim 1 wherein the second layer comprises $SiO_2$.

10. The insulated strain gage of claim 1 wherein the first layer comprises silicon.

11. The insulated strain gage of claim 10 wherein the silicon is p-doped.

12. The insulated strain gage of claim 10 wherein the silicon is doped with boron.

13. The insulated strain gage of claim 10 wherein the silicon is n-doped.

14. The insulated strain gage of claim 1 wherein the adhesive has a thickness of approximately 6.0 µm.

15. The insulated strain gage of claim 1 wherein the second layer has a thickness in the range of 1.5 µm to 2.5 µm.

16. The insulated strain gage of claim 1 wherein the second layer has a thickness in the range of 0.5 µm to 1.5 µm.

17. The insulated strain gage of claim 1 wherein the first and second layers have a combined thickness of approximately 4.0 µm.

18. An insulated strain gage comprising:
- a first layer, wherein the first layer has first and second opposing surfaces, wherein the first layer has first, second, third, and fourth sides joining the first and second opposing surfaces, and wherein the first layer comprises a semiconductive material;
- a second layer, wherein the second layer comprises an insulating material, wherein the second layer has first and second opposing surfaces, and wherein the first surface of the second layer is disposed against the first surface of the first layer; and,
- a third layer, wherein the third layer comprises an insulating material, wherein the third layer has first and second opposing surfaces, wherein the first surface of the third layer is disposed against the second surface of the first layer, wherein the third layer includes first and second openings, and wherein both of the first and second openings extend from the first surface of the third layer to the second surface of the third layer; and,
- a first contact pad and a second contact pad, wherein the first contact pad fills the first opening, wherein the second contact pad fills the second opening, and wherein the first and second contact pads are located distally from one another and electrically engage the first layer.

19. The insulated strain gage of claim 18 wherein the first and second contact pads are aluminum.

20. The insulated strain gage of claim 18 wherein the third layer has portions against the first, second, third, and fourth sides of the first layer.

21. The insulated strain gage of claim 18 wherein the third layer has portions against the first and second sides of the first layer.

22. The insulated strain gage of claim 18 wherein the insulated strain gage has a thickness of approximately 6.0 µm.

23. The insulated strain gage of claim 18 wherein the insulating materials of the second and third layers are the same material.

24. The insulated strain gage of claim 18 wherein the insulating materials of the second and third layers comprise $SiO_2$.

25. The insulated strain gage of claim 18 wherein the first layer comprises silicon.

26. The insulated strain gage of claim 25 wherein the silicon is p-doped.

27. The insulated strain gage of claim 25 wherein the silicon is n-doped.

28. The insulated strain gage of claim 18 further comprising an adhesive bonding the second surface of the second layer to a sensor.

29. The insulated strain gage of claim 28 wherein the adhesive has a thickness of approximately 6.0 µm.

30. The insulated strain gage of claim 18 wherein a thickness of the second layer has a range of 1.5 µm to 2.5 µm.

31. The insulated strain gage of claim 18 wherein a thickness of the second layer has a range of 0.5 µm to 1.5 µm.

32. The insulated strain gage of claim 18 further comprising a circuit connected to the insulated strain gage to receive signals indicating an electrical value of the insulated strain gage.

33. An apparatus comprising first and second insulated strain gages and a circuit, wherein each of the first and second insulated strain gages comprises:
- a first layer, wherein the first layer has first and second opposing surfaces, wherein the first layer has first, second, third, and fourth sides joining the first and second opposing surfaces, and wherein the first layer comprises a semiconductive material;
- a second layer, wherein the second layer comprises an insulating material, wherein the second layer has first and second opposing surfaces, and wherein the first surface of the second layer is disposed against the first surface of the first layer; and,
- a third layer, wherein the third layer comprises an insulating material, wherein the third layer has first and second opposing surfaces, wherein the first surface of the third layer is disposed against the second surface of the first layer, wherein the third layer includes first and second openings, and wherein both of the first and second openings extend from the first surface of the third layer to the second surface of the third layer; and,
- a first contact pad and a second contact pad, wherein the first contact pad fills the first opening, wherein the second contact pad fills the second opening, and wherein the first and second contact pads are located distally from one another and electrically engage the first layer; and,
- wherein the circuit connects to the first and second contact pads of the first and second insulated strain gages to receive signals indicating corresponding electrical values of the first and second insulated strain gages.

34. The apparatus of claim 33 wherein the first and second insulated strain gages are connected electrically in series.

35. The apparatus of claim 33 wherein the circuit includes a Wheatstone Bridge, wherein the first and second insulated strain gages are corresponding resistors on adjacent legs of the Wheatstone Bridge, and wherein the first and second insulated strain gages are in series with respect to an input excitation and in parallel with respect to an output terminal.

36. The apparatus of claim 35 wherein the circuit includes an amplifier coupled to the output terminal.

37. The apparatus of claim 33 wherein the first and second insulated strain gages are mounted to a sensor.

38. The apparatus of claim 37 wherein the first and second insulated strain gages are connected electrically in series.

39. The apparatus of claim 37 wherein the circuit includes a Wheatstone Bridge, wherein the first and second insulated strain gages are corresponding resistors on adjacent legs of the Wheatstone Bridge, and wherein the first and second insulated strain gages are in series with respect to an input excitation and in parallel with respect to an output terminal.

40. The apparatus of claim 39 wherein the circuit includes an amplifier coupled to the output terminal.

* * * * *